(12) United States Patent
Serjack et al.

(10) Patent No.: US 6,728,114 B2
(45) Date of Patent: Apr. 27, 2004

(54) SPACE-SAVING CARD GUIDES FOR CARD CAGE AND METHOD OF INSTALLING SAME ON A CARD CAGE OR FRAME

(75) Inventors: Peter Serjack, Stittsville (CA); Stefano De Cecco, Ottawa (CA)

(73) Assignee: Alcatel Canada Inc., Ottawa (CA)

( * ) Notice: Subject to any disclaimer, the term of this patent is extended or adjusted under 35 U.S.C. 154(b) by 0 days.

(21) Appl. No.: 10/189,177

(22) Filed: Jul. 5, 2002

(65) Prior Publication Data

US 2004/0004824 A1 Jan. 8, 2004

(51) Int. Cl.$^7$ .............................. H05K 7/14; H05K 7/18
(52) U.S. Cl. ................... 361/802; 361/686; 361/732; 361/740; 361/741; 361/747; 361/756; 361/759; 361/796; 361/801; 439/64; 211/41.17
(58) Field of Search .................. 361/721, 728, 361/732, 740, 741, 747, 752, 756, 759, 796, 801, 802, 736, 742, 758, 689, 683–686, 787, 769, 770, 797, 804, 754, 753; 489/377, 64; 211/41.17; 312/223.2, 223.1

(56) References Cited

U.S. PATENT DOCUMENTS

| | | | | |
|---|---|---|---|---|
| 3,231,785 A | * | 1/1966 | Calabro | 361/689 |
| 3,762,574 A | * | 10/1973 | Bentley et al. | 211/41.17 |
| 3,863,113 A | * | 1/1975 | Ward | 211/41.17 |
| 3,878,438 A | * | 4/1975 | Weisman | 361/802 |
| 3,898,536 A | * | 8/1975 | Wyshak et al. | 361/802 |
| 3,899,721 A | * | 8/1975 | Borchard et al. | 361/802 |
| 4,022,326 A | * | 5/1977 | Marconi | 211/41.17 |
| 4,065,200 A | * | 12/1977 | D'Angelo | 439/377 |
| 4,075,683 A | * | 2/1978 | Johansson et al. | 361/802 |
| 4,096,547 A | * | 6/1978 | Calabro | 361/708 |
| 4,327,835 A | * | 5/1982 | Leger | 211/41.17 |
| 4,335,819 A | * | 6/1982 | Weisman et al. | 211/41.17 |
| 4,976,358 A | * | 12/1990 | Stickel et al. | 211/41.17 |
| 5,055,061 A | * | 10/1991 | Lichtenwalter | 439/377 |
| 5,187,648 A | * | 2/1993 | Ito | 361/816 |
| 5,394,305 A | * | 2/1995 | Moral et al. | 361/776 |
| 5,828,556 A | * | 10/1998 | Zenitani et al. | 361/802 |
| 6,215,674 B1 | * | 4/2001 | Bertolami | 361/807 |
| 6,269,006 B1 | * | 7/2001 | Treiber et al. | 361/756 |

\* cited by examiner

*Primary Examiner*—Phuong T. Vu
(74) *Attorney, Agent, or Firm*—Jim Zegeer

(57) ABSTRACT

A method and apparatus for mounting a plurality of circuit card guides on a circuit card cage. The cage has two pairs of end fingers at each end of a mounting surface, and an arch proximate the center thereof. Each card guide has end tabs and a central medial tab having a lateral edge. One set of end fingers is engaged with one of the set of end tabs and the card guide is flexed in the plane thereof to shorten the distance between the ends of the end tabs and fit the other pair of end tabs under the other pair of end fingers. Unflexing the guide fit the tabs under the end fingers. The card is flexed transverse to the plane thereof so the edge of the tab is beyond the arch allowing the guide to unflex so that the tab is moved under the arch.

9 Claims, 3 Drawing Sheets

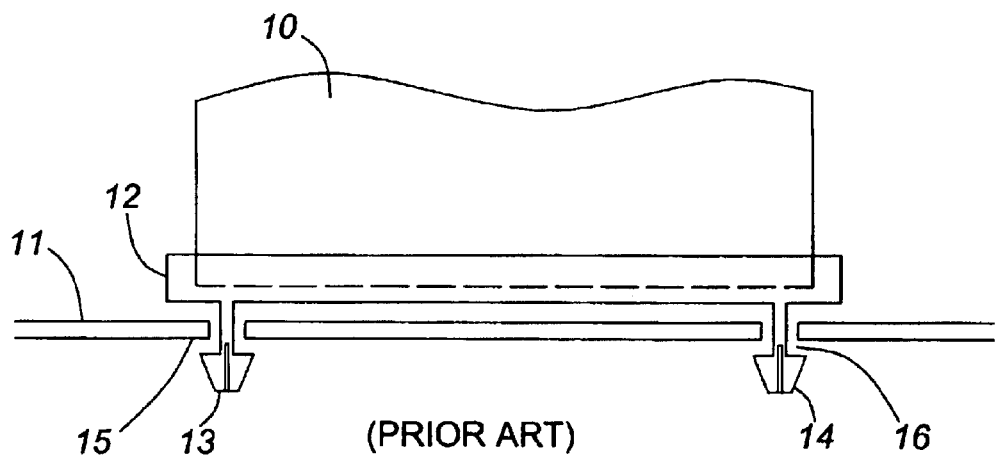
(PRIOR ART)
FIG. 1
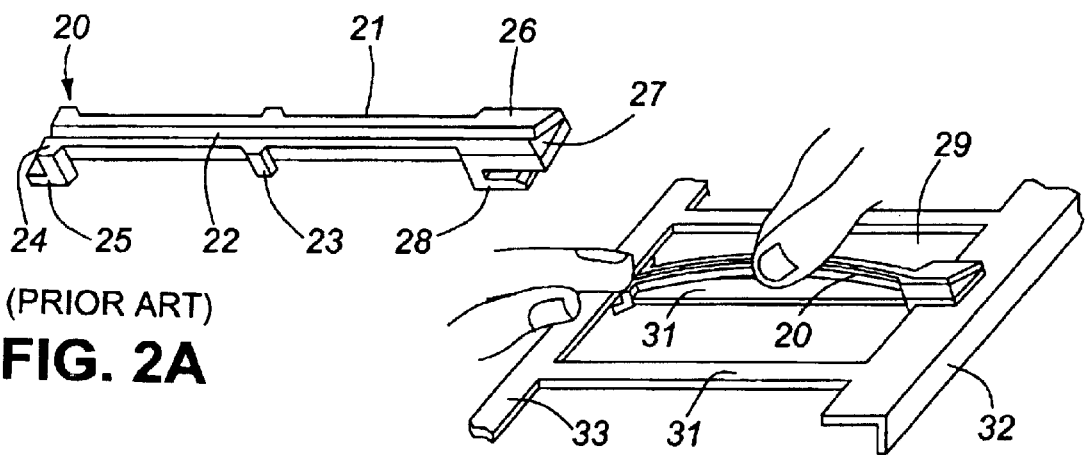
(PRIOR ART)
FIG. 2A
(PRIOR ART)
FIG. 2B
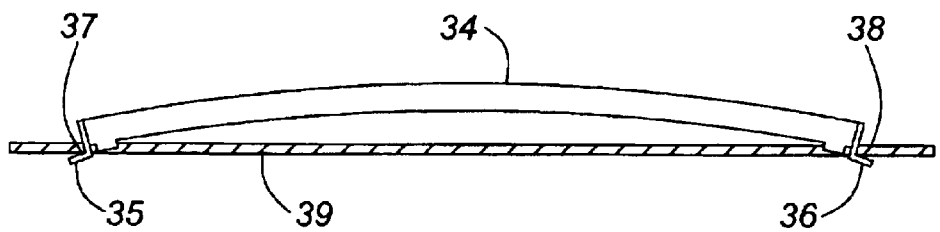
(PRIOR ART)
FIG. 3

SPACE-SAVING CARD GUIDES FOR CARD CAGE AND METHOD OF INSTALLING SAME ON A CARD CAGE OR FRAME

FIELD OF THE INVENTION

The invention is directed to the problem of efficient use of space in an electronic system that has circuit cards housed in a card cage. More particularly, the invention is directed to the efficient use of space in the design of the card cage and the card guides of the cage and especially the mounting of the card guides on the card guide cage.

BACKGROUND AND BRIEF DESCRIPTION OF THE INVENTION

FIG. 1 shows a cross-sectional side view of a typical prior art card guide arrangement. Circuit card 10 is held in place on a card cage 11 by a card guide 12. The card cage 11 is part of an arrangement, e.g. a standard 20" card rack, for housing the circuit cards of an electronic system. The card guide 12 is made from a material that is flexibly resilient, e.g. plastic. The card guide 10 is held in place on the card cage 11 by two or more mushroom headed mounting lugs 13, 14. The lugs are compressible by the nature of their shape and the flexibly resilient material of which the guide is composed so as to fit through respective apertures in the card cage and expanding back to their original shape after insertion, thereby affixing the card guide to the card cage. Typically, one of the apertures, aperture 15, is circular for precisely locating the guide on the cage, while the other aperture, aperture 16 is oblong, which allows relative movement between the remainder of the guide and the cage. This allowance is necessary to accommodate different amounts of expansion and contraction of the card and guide due to normal thermal cycling during operation of the electronic system however, this allowance has some times allowed the guide to detach from the cage due to normal thermal cycling.

Referring to FIGS. 2A and 2B (which correspond to FIGS. 3 and 4 of U.S. Pat. No. 3,878,438 entitled Printed Circuit Card Guide), the card guide 20 has depending tabs 25, 28 at the lateral ends which fit into apertures in the card cage 31, 32, 33. Tabs 25, 28 protrude below the surface of the card cage into the card case interior and therefore do not achieve space savings. Moreover, the central portions of the card guide 20 are not secured to the card cage.

Referring now to FIG. 3 (which corresponds to FIG. 5 of U.S. Pat. No. 4,327,835 entitled "Universal Snap-In Card Guide for Printed Circuit Card Enclosures,") the card guide 34 has tabs 35, 36 at each end which fit into apertures 37, 38 in the card cage 39. As in the case of FIGS. 2A and 2B, the tabs 35, 36 protrude below the surface of the card cage into the card cage interior and therefore do not achieve the desired space savings.

U.S. Pat. No. 5,738,226 issued to Dean on Apr. 14, 1998 entitled "Guide Piece and Method for Mounting to a Chassis in Multiple Orientations" discloses a card guide. This patent is directed to the same problem of eliminating the protrusion of the guide mounting means to the card chassis/cage (albeit for a different reason). This patent uses tabs on one surface of the card guide that engage fingers on the card cage and nubs on another surface on a guide that engages with holes on the card cage to mount the guides in a manner that eliminates the protrusions. However, unlike the present invention in which the tabs, fingers and arches provide alignment locking all on one side of the cage mount, the prior art requires additional fingers to provide alignment and locking to complete the alignment in the locking means.

Typically, the retention pins protrude about ⅛" below the card cage, which is an area that is often required for EMI shielding. Since there are two guides (an upper and a lower) required for each card, the space required for retention pins in a 20" rack having four layers of circuit cards would be 1" (2×4×⅛"), or about 5% of the height of the rack. Since space is usually at a premium in electronic systems, any space savings can be valuable and provide a commercial advantage to the systems, e.g. by allowing the size of the circuit cards to be increased thereby enabling more functionality to be fit onto a card.

THE PRESENT INVENTION

The object of the present invention is to provide an improved circuit card mounting guide and method of installing the card guide on a card cage or frame.

The invention features a circuit card guide for mounting onto a member of a circuit card cage, comprising: an elongated body of a flexibly resilient material having a groove extending along its longitudinal axis for receiving the edge of a printed circuit card, the groove being open at least at one end of the elongated body; and first and second outer surfaces extending along the longitudinal axis and being opposite to each other with respect to the groove, each outer surface having a tab disposed adjacent each end of the elongated body, each tab adapted to be received by fingers on the member; whereby flexing the circuit card guide about the longitudinal axis allow the tabs to be received by the member and allowing the circuit card guide to return to an unflexed state securely mounts the circuit card guide onto the member.

The invention also features:

1. Coplanar tabs which extend perpendicular to the first and second outer surfaces,
2. One of the first and second outer surfaces has a medial tab disposed at a location substantially halfway between the ends of the elongated body for being received by the member when the guide is in the unflexed state.
3. A ramp provided at the open end for slidably receiving a circuit card.
4. A circuit card guiding flare is formed in the groove at the open end.

The invention further features a circuit card cage for housing circuit cards, comprising: a circuit card guide; and a cage frame member having mounting means for mounting a plurality of circuit card guides, the circuit card guides being as described above.

Flexing the circuit card guide about the longitudinal axis allows the tabs to be received by the mounting means and allowing the circuit card guide to return to an unflexed state securely mounts the circuit card guide onto the member.

The invention also features:

1. The cage mounting structure comprises two pairs of fingers for engaging the end tabs, the fingers of each pair being pointed toward the other pair and parallel to the longitudinal axis of the circuit card guide in a mounted position on the member, so no part of the card guide protrudes below the mounting structure surface.
2. Each finger of a pair registers with a respective one of the first and second outer surfaces to alleviate movement of the guide relative to the cage member that is transverse to the longitudinal axis.
3. The pairs of fingers are spaced apart relative to each other such that movement of the card guide relative to the cage member that is along the longitudinal axis is allowed to accommodate differences in thermal expansion and contraction of the circuit card guide and cage member.

4. The tabs extend perpendicular to the first and second outer surfaces.

5. One of the first and second outer surfaces has a medial tab disposed at a location substantially halfway between the ends of the elongated body for being received by a corresponding medial arch of the cage member when the guide is in the unflexed state.

A further feature of the invention is in the method of installing or mounting the card guide on the card guide cage. According to this feature of the invention, there is provided on the surface of the card cage two pairs of end fingers and a medial arch proximate the center of the card cage member. The method comprises first engaging one of the end tab pairs with an end finger pair, flexing the card guide in the plane thereof to engage the other end tab pair with the second set of end fingers at the opposite end thereof. The card guide is then flexed out of the plane thereof so as to permit a medial tab to engage a medial arch member. Thus, the card guide is mounted on the card guide cage by first seating the pairs of end tabs in the end finger pairs by first flexing in the direction of the plane of the card guide and then after seating the end tabs in the end tab fingers, the card guide is flexed out of the plane thereof so as to permit the medial tab to seat under its corresponding medial arch.

BRIEF DESCRIPTION OF THE DRAWINGS

The above and other objects, advantages and features of the invention will become more apparent when considered with the following specification and accompanying drawings wherein:

FIG. 1 is a side elevational view of a prior art card guide arrangement commonly used in the art, FIGS. 2A and 2B are perspective views from U.S. Pat. No. 3,878,438, FIG. 3 is a side elevational view of a card guide taken from U.S. Pat. No. 4,327,835.

DETAILED DESCRIPTION OF THE INVENTION

Figure 4A:
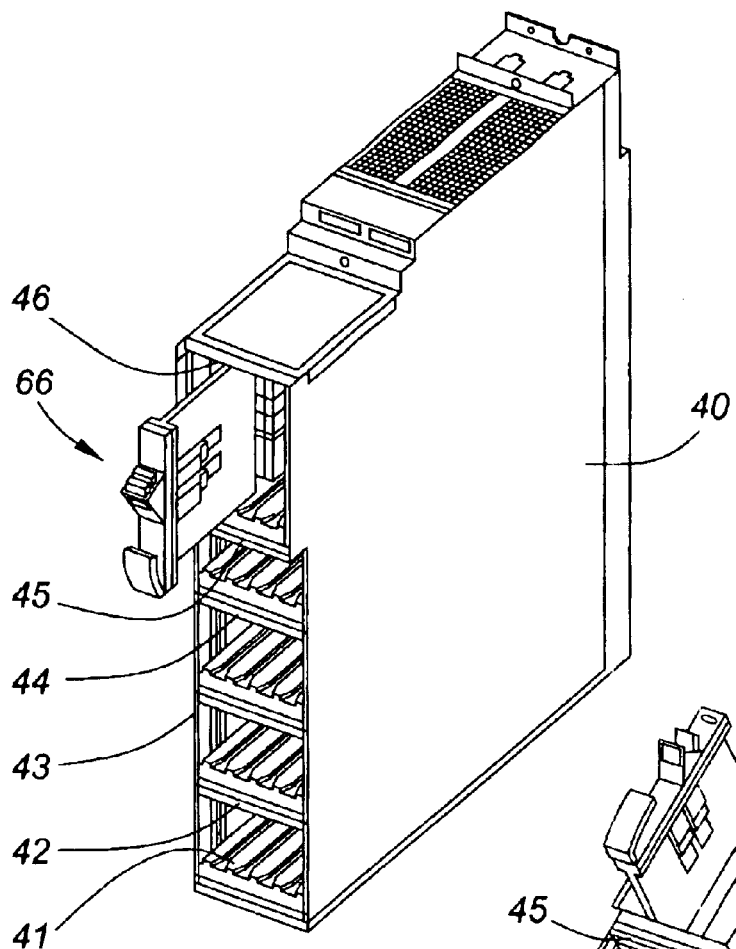
FIG. 4A is an isometric view of an electronic system housing containing a plurality of card guides and card guide cages incorporating the invention, said isometric view being taken from above and to the right.
Figure 4B:
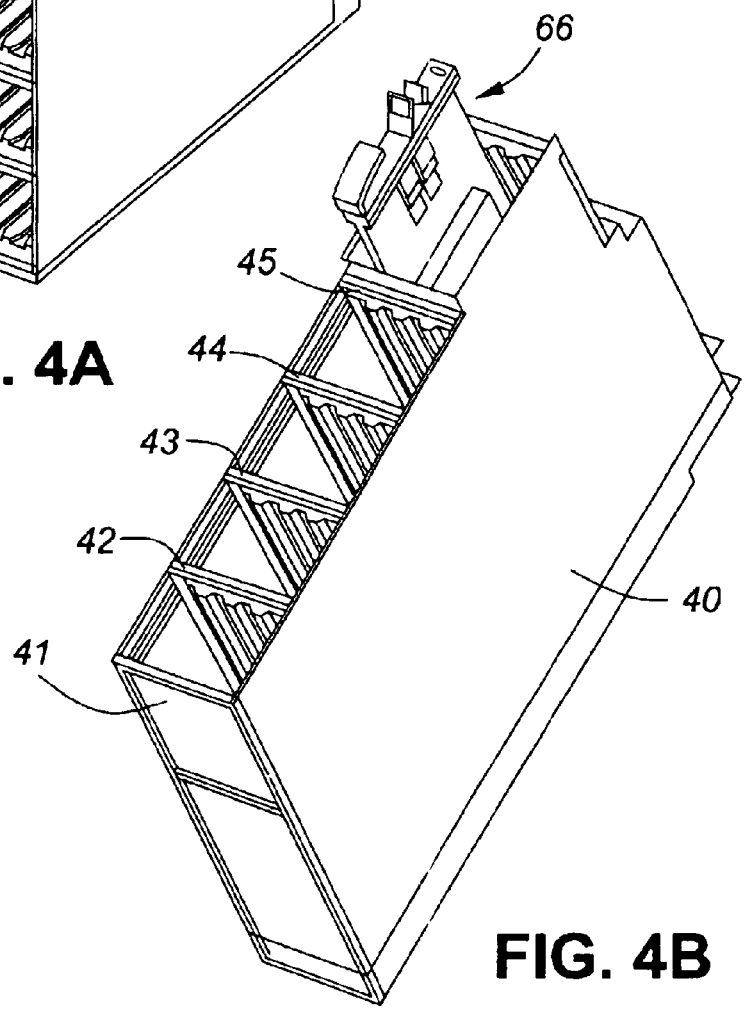
FIG. 4B is a view of the same electronic system package housing taken from the bottom right.
Figure 5:
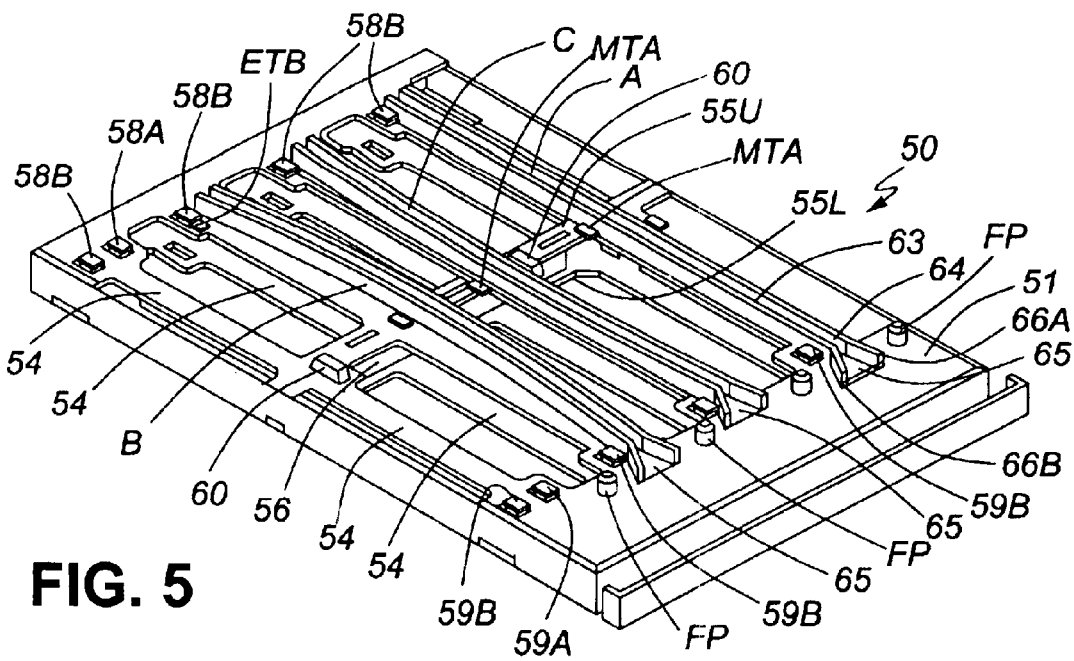
FIG. 5 is an isometric view of a card cage and three card guides, one of which is fully mounted thereon, and a third of which is shown in a flexed state in a plane thereof for mounting the end tabs in the end finger, and the center card guide in a flexed state transverse to the plane of the card guide for seating the medial tabs in the medial tab arches.
Figure 6:
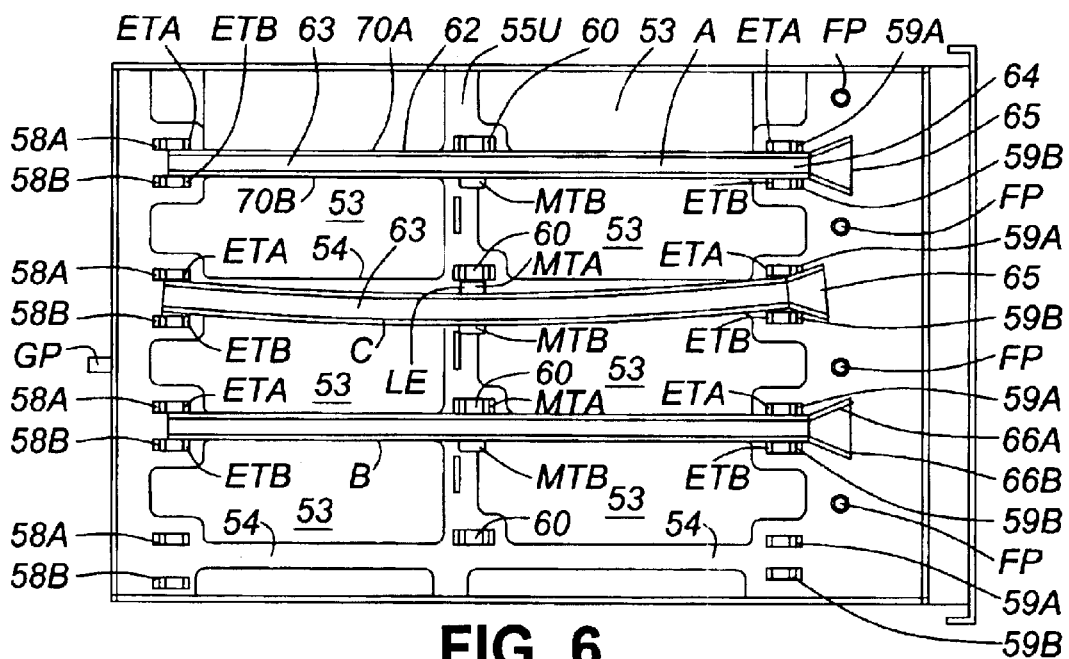
FIG. 6 is a top plan view thereof.
Figure 7:
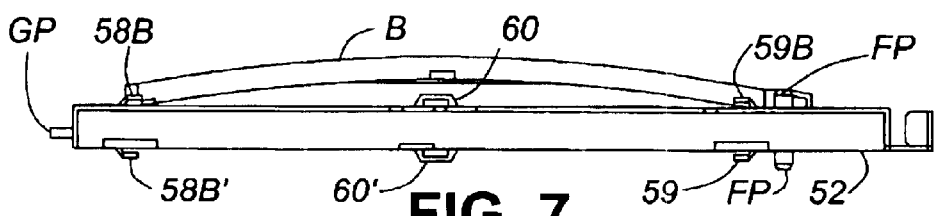
FIG. 7 is a side elevational view thereof.

Referring now to FIGS. 4A and 4B, an electronic system enclosure 40 includes a plurality of card guide support structures and card cage assemblies 41, 42, 43, 44, 45 and 46, the card cage assemblies 42–45 having a general structure shown in FIGS. 5, 6 and 7, the end or top and bottom assemblies 41 and 46 having card guides only on one side. A circuit card or board CC is shown with its top and bottom edges engaged with their respective upper and lower card guide grooves. When fully seated, circuit pads on the card edge engage conventional circuit board sockets in the interior of the housing 40. Faceplate structures on each circuit card CC engage faceplate pins F P (FIGS. 5, 6 and 7) on the card cages.

FIGS. 4A and 4B reflect the fact that space in electronic system housing is at a premium, and that even small space savings translate into significant gains in functional space of an overall electronic system enclosure.

Referring now to FIGS. 5, 6 and 7, card cage member 50 is comprised of formed sheet metal, has upper 51 and lower 52 sides which are essentially identical and perform the same function; so only the upper side 51 will be described. A plurality of circuit card guide mounting structures are formed on the surface 51 (and 52). Initially, it will be observed that the surfaces are perforated with a plurality of rectangular air flow openings 53 between card guide backing members 54. These large openings 53 serve to allow maximum cooling of the printed circuit boards, one of which is shown in FIGS. 4A and 4B as being inserted into an electronic systems housing 40. Cross-members 55U on upper side 5 and 55L on the lower side 52 are joined by stiffener member 56 to provide rigidity and stiffness.

The circuit card guide mounting structure per se for each circuit guide comprises end finger pairs 58A, 58B and 59A, 59B and medial arch 60. In the embodiment illustrated, four sets of oppositely facing fingers or hooks 58 and 59 are provided on each surface 51 and 52 and medial card guide mounting arches are formed on the intermediate brace member 55. Except for the strengthening rib 56 and card cage guide pin GP and faceplate pins LP, the card cage is preferably one sheet of sheet metal which has been rolled and formed to the shape illustrated.

In FIGS. 5, 6 and 7, three card guides are illustrated: circuit card guides A, B and C, in different stages of installation. Each circuit card guide includes an elongated body 62 made of resilient material and having a longitudinal axis. A groove or channel 63 extends along the longitudinal length of the circuit card guide 62 and has an end 64 for receiving the edge (see FIGS. 4A and 4B) of a printed circuit card. The groove is open at the end 64 which has a ramp 65 and flared sides 66A and 66B. The elongated body member 62 has a bottom surface forming the bottom of the groove or the channel and side walls forming the groove. The side walls have first and second outer surfaces 70A, 70B; and each outer surface has at least one lateral end tab ETA and ETB which are coplanar with each other and the bottom surface of the body member 62 and extend perpendicular to the surfaces 70A and 70B. Intermediate the ends of the card guide 62 are formed medial tabs MTA and MTB, only one of which is used in each mounting arrangement.

As noted earlier, FIGS. 5, 6 and 7 show three circuit card guides: The card guide A is shown fully installed or mounted; card guide B is shown in the initial stage of installation in a flexed state in the plane thereof; and, card guide C is shown in the final stage of installation or mounting to the card cage 50. Card guide B is shown with its right end tabs ETA, ETB (right tabs in FIGS. 5, 6 and 7) engaged with finger pairs 59A and 59B and is arched or flexed in the plane thereof (see FIGS. 5 and 7). Referring to card guide B, the left end tabs ETA and ETB are shown just about to slide under the end fingers 59A and 59B, respectively, the right end tabs are engaged with their respective fingers. When guide B is released or unflexed, the natural resiliency of the material of guide B which the card guide is made extends the left end tabs ETA and ETB beneath the fingers that securely mount the ends of the card guide C onto the card guide frame 50. At this time, the medial tab MTA is resting on the medial arch 60. As shown in FIGS. 5 and 6, after the engagement of the end tabs with the oppositely facing fingers or hooks, card guide C is deflected or flexed transverse to the plane thereof so that the lateral edge LE of the medial tab MTA is beyond the medial arch 60 allowing the medial tab to drop beneath the medial arch 60. Then the card guide is allowed to unflex or straighten out due to the natural resiliency inherent in the material of which it is made so that the medial tab MTA slides or fits under the medial arch 60. It will be noted that only one of the medial tabs MTA per card guide is used which makes the card guide universal so that it can be used on the opposite side 52.

Summarizing, the card guide 62 of the present invention has pairs of coplanar end tabs ET extending from the sides of the card guide 62 at each end. Additional medial tabs MT on either side of the card guide 62 extends from the approximately the middle of the guide 62. Only one medial tab is used. The card guide 62 has the usual groove 63 for holding a circuit card and a ramp 65 and guide flare 66A, 66B at one end to make sliding the circuit card into the groove easier.

The card guide cage 50 has finger pairs 58A and 58B which engage the tabs ETA, ETB at each end of the guide to securely mount the guide onto the cage. An arch 60 on the cage on one side of the guide engages one of the medial tabs MT at the middle of the guide. There is a small amount of play to allow movement along the direction of the groove while the fingers abut the sides of the guide to prevent sideways movement of the guide relative to the cage. The allowed movement is to accommodate differing amounts of expansion and contraction of the card and guide due to thermal cycling.

The card guide is inserted into the cage by inserting the tabs at one end into their corresponding fingers in the cage. The guide is then flexed about its length in the plane thereof to insert the tabs at the other end into their corresponding fingers. The guide is then flexed sideways (transverse to the lane thereof) while releasing the original flexing force to fit one of the middle tabs into the medial arch on the cage.

By eliminating the protrusions of the guide under the surface of the cage, a valuable space savings is achieved over prior art patents depicted in FIGS. 2 and 3 and the prior art shown in FIG. 1. This is done while keeping the design of the mounting mechanism of the guide simpler than the prior art, thereby making it easier to manufacture and assemble, and allowing for play to accommodate thermal cycling which is not provided by prior art FIGS. 2A, 2B and 3. Therefore, the invention achieves valuable space savings with a design that is more thermally robust and less expensive to manufacture and assemble.

Space in electronic system housings is at a premium. The invention reduces the amount of space required for a typical 4 circuit card chassis by about 5%, which can be translated to a 5% gain in circuit board area. Therefore, the invention enables more functionality to be delivered for the same system dimensions.

While the invention has been described in relation to preferred embodiments of the invention, it will be appreciated that other embodiments, adaptations and modifications of the invention will be apparent to those skilled in the art.

What is claimed is:

1. A circuit card guide mounted onto the surface of a circuit card cage having two finger pairs struck from the surface thereof and a centrally located medial arch struck from said surface, wherein the fingers of one finger pair are oppositely facing the fingers of the second finger pair said circuit card guide including an elongated body made of resilient material and having a longitudinal axis and a groove extending along its longitudinal length for receiving the edge of a printed circuit card, said groove being open at least at one end of said elongated body, said elongated body having a bottom surface, first and second outer surfaces extending along the longitudinal axis and being opposite each other with respect to said groove, each said outer surface having at least one lateral end tab at each end thereof, wherein the end tabs on one end of the elongated body of the circuit card guide define a first pair of end tabs and the end tabs on the opposite end of the elongated body define a second pair of end tabs each said end tab of the first pair of end tabs being received by one of said finger pairs, whereby flexing of said circuit card guide in the plane of said longitudinal axis allows the second pair of said end tabs to be received by the other of said finger pairs, and when said circuit card guide is allowed to return to an unflexed state, securely mount said circuit card on said surface without any portion of said circuit card guide protruding below said surface of said circuit card cage.

2. The circuit card guide defined in claim 1 wherein said end tabs are coplanar and extend perpendicular to said first and second outer surfaces.

3. The invention defined in claim 1 wherein at least one of said first and second outer surfaces each have a medial tab at a location substantially halfway between the ends of said elongated body and a medial arch is formed on said surface of said circuit card cage at a position intermediate the two finger pairs, and said card guide is flexed transverse to the plane thereof to fit said medial tab under said medial arch.

4. The circuit card guide defined in claim 1 wherein said grove being open at least at one end of said elongated body is provided with a ramp for slidably receiving a circuit card.

5. The circuit card guide defined in claim 1 wherein said one end of said elongated body of the circuit card guide has a flare thereon for guiding said circuit card into said groove.

6. The invention defined in claim 1 including said circuit card cage, and wherein said two finger pairs and said medial arch are all coplanar.

7. The invention defined in claim 6 wherein said card cage surface includes said finger pairs or engaging said end tabs, the fingers of one pair being pointed toward the fingers of the other pair and are parallel to the longitudinal axis of said circuit card guide in a mounted position on said member.

8. The invention defined in claim 1 wherein each said finger of said finger pairs engage with respective ones of said end tabs of said pairs of end tabs to alleviate movement of the guide relative to said cage member that is transverse to the longitudinal axis.

9. A method of mounting circuit card guides on a circuit card cage comprising: providing a circuit card cage having a mounting surface and two pairs of end fingers, one pair at each end of said mounting surface, and a medial arch proximate the center of said card cage surface, providing a card guide having a set of end tabs at each longitudinal end thereof and a central medial tab having a lateral edge, said method further comprising:

engaging one of said pair of end fingers with one of said set of end tabs and flexing said card guide in the plane thereof so as to shorten the distance between the ends of said set of end tabs and fit the other of said set of end tabs under the other of said pair of end fingers and unflexing said card guide so that said end tabs fit under said end fingers, then flexing said card guide transverse to the plane thereof so that the lateral edge of said medial tab is beyond said medial arch and allowing said card guide to unflex so that said medial tab fits under said medial arch.

* * * * *